(12) United States Patent
Takizawa

(10) Patent No.: US 6,998,300 B2
(45) Date of Patent: Feb. 14, 2006

(54) METHODS FOR MANUFACTURING SEMICONDUCTOR DEVICES

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/812,590

(22) Filed: Mar. 29, 2004

(65) Prior Publication Data

US 2004/0217387 A1 Nov. 4, 2004

(30) Foreign Application Priority Data

Mar. 28, 2003 (JP) .............................. 2003-091521

(51) Int. Cl.
*H01L 29/74* (2006.01)
(52) U.S. Cl. ...................... 438/149; 438/105; 438/257; 438/285; 438/593; 438/931
(58) Field of Classification Search ................ 438/105, 438/257, 285, 593, 931
See application file for complete search history.

(56) References Cited

U.S. PATENT DOCUMENTS 6,746,893 B1 * 6/2004 Forbes et al. ............... 438/105

* cited by examiner

*Primary Examiner*—Mai-Huong Tran
(74) *Attorney, Agent, or Firm*—John J. Penny, Jr.; Edwards Angell Palmer & Dodge

(57) ABSTRACT

A multiple layered wafer structure having, on a semiconductor substrate, a first dielectric layer, a single crystal semiconductor layer formed on the dielectric layer, a semiconductor nano-crystal layer formed on the single crystal semiconductor layer, and a second dielectric layer formed on the semiconductor nano-crystal layer. A laser is irradiated from the side of the second dielectric layer, to thereby separate the second dielectric layer from the others of the multiple layered wafer structure.

10 Claims, 4 Drawing Sheets

METHODS FOR MANUFACTURING SEMICONDUCTOR DEVICES

Applicant claims foreign priority to Japanese Application No. 2003-091521 filed on Mar. 28, 2003, which is hereby incorporated by reference in its entirety.

BACKGROUND

1. Field of the Invention

The present invention relates to a method for manufacturing a semiconductor wafer having a multiple layered structure, and a semiconductor device manufactured using the same. In particular, it relates to a semiconductor device having the multiple layered structure that is a silicon on insulator (SOI) structure.

2. Description of Related Art

At present, lower power consumption and longer operation hours of portable information terminal devices in the semiconductor industry are demanded on the market. Above all, it is one of the most important tasks to reduce power consumption of semiconductor devices that compose portable information terminal devices. In recent years, the silicon on insulator (SOI) technique has been developed as a technique to lower the power consumption of semiconductor devices. According to this technique, a silicon oxide layer, that is a dielectric film, is embedded in a conductive silicon substrate wafer, thereby reducing leak current from a semiconductor device to the substrate and reducing parasitic capacitance of MOS transistors, to achieve a lower power consumption in a semiconductor device.

Methods for providing SOI wafers may be generally divided in two methods. One of them is an oxygen implantation method, which is called a SIMOX (Separation by Implanted Oxygen) method, and the other one is a lamination method in which two wafers are laminated by intermolecular force. As a result of recent research, both of the methods have been improved to a level where their quality does not affect the device characteristics. However, there are still problems yet to be resolved. In particular, in view of mass-production, the oxygen implantation method needs oxygen ions to be implanted in large quantities and for a long time, which leads to a problem of long processing hours for each wafer. On the other hand, the lamination method is superior because embedded dielectric films are formed by thermal oxidation, such that the processing time can be shortened compared to the oxygen implantation method. However, the following complex processes are required after lamination. One of them is a process that requires a separation step by hydrogen ion implantation and an etching-polishing step. Another is a process that requires steps of providing a porous layer with a reduced mechanical strength in the laminated wafer, and conducting separation by applying water pressure.

A process of conducting separation by application of water pressure is described below with reference to FIG. 4. A porous silicon layer 10, a single crystal silicon layer 3 and a silicon oxide film (embedded dielectric film) 2 are provided on the side of a silicon substrate (support substrate) 11, which is laminated with a silicon substrate 1. As pure water is shot with high pressure against the porous silicon layer 10 from the side surfaces of the multiple layered wafer structure, the porous silicon layer 10 with a low mechanical strength is destroyed, such that a silicon on insulator structure 8 is separated from the silicon substrate (support substrate) 11.

This process requires a method for forming the porous silicon layer 10 that is mechanically weak on the support substrate 11 and the single crystal silicon layer 3 with good control, and a technique that converges water pressure on the thin porous silicon layer 10, which requires many complex mechanical devices. Also, at the time of separation with water pressure, since a uniform stress needs to be applied to the entire wafer, water pressure needs to be applied while the wafer is slowly rotated, which leads to a longer processing time for each wafer. The high level control, complex machinery, longer processing time increase the cost of each SOI wafer.

SUMMARY OF THE INVENTION

In view of the above, the present invention provides high quality SOI wafers at low cost, which do not require a high level control technique or long processing hours. Moreover, with low cost SOI wafers fabricated by the present invention, semiconductor devices, as well as portable information devices, with reduced power consumption are provided.

First, the present invention is characterized in that, with a multiple layered wafer structure having, on a semiconductor substrate, a first dielectric layer, a single crystal semiconductor layer formed on the dielectric layer, a semiconductor nano-crystal layer formed on the single crystal semiconductor layer, and a second dielectric layer formed on the semiconductor nano-crystal layer, a laser is irradiated from the side of the second dielectric layer, to thereby separate the second dielectric layer from the other layers of the multiple layered wafer structure.

Second, the present invention is characterized in that the multiple layered wafer structure is fabricated by: forming a single crystal or polycrystalline semiconductor layer on a second dielectric layer; changing the single crystal or polycrystalline semiconductor layer to a semiconductor nano-crystal layer by an anode formation method; heat treating a surface of the semiconductor nano-crystal layer in a hydrogen atmosphere; forming a semiconductor single crystal layer on the semiconductor nano-crystal layer; oxidizing a part of the surface of the semiconductor single crystal layer; laminating an oxide film on the surface of the single crystal semiconductor layer to another semiconductor substrate; and conducting heat treatment after the lamination step.

Third, the present invention is characterized in that the multiple layered wafer structure, when separated, assumes to be a silicon on insulator (SOI) structure.

Fourth, the present invention is characterized in that the second dielectric layer is a sapphire, a quartz or another light-transmissive dielectric substrate.

Fifth, the present invention is characterized in that the laser irradiation is conducted with an excimer laser.

Sixth, the present invention is characterized in that the step of forming the single crystal semiconductor layer on the semiconductor nano-crystal layer is conducted by one of a metal organic chemical vapor deposition method (MO-CVD method), a molecular beam epitaxial method (MBE method), and an ultra high vacuum chemical vapor deposition method (UHV-CVD method).

Seventh, the present invention pertains to all semiconductor devices that are manufactured by using any of the first through sixth semiconductor manufacturing methods recited above.

DESCRIPTION OF THE PRESENT INVENTION

Figure 1:
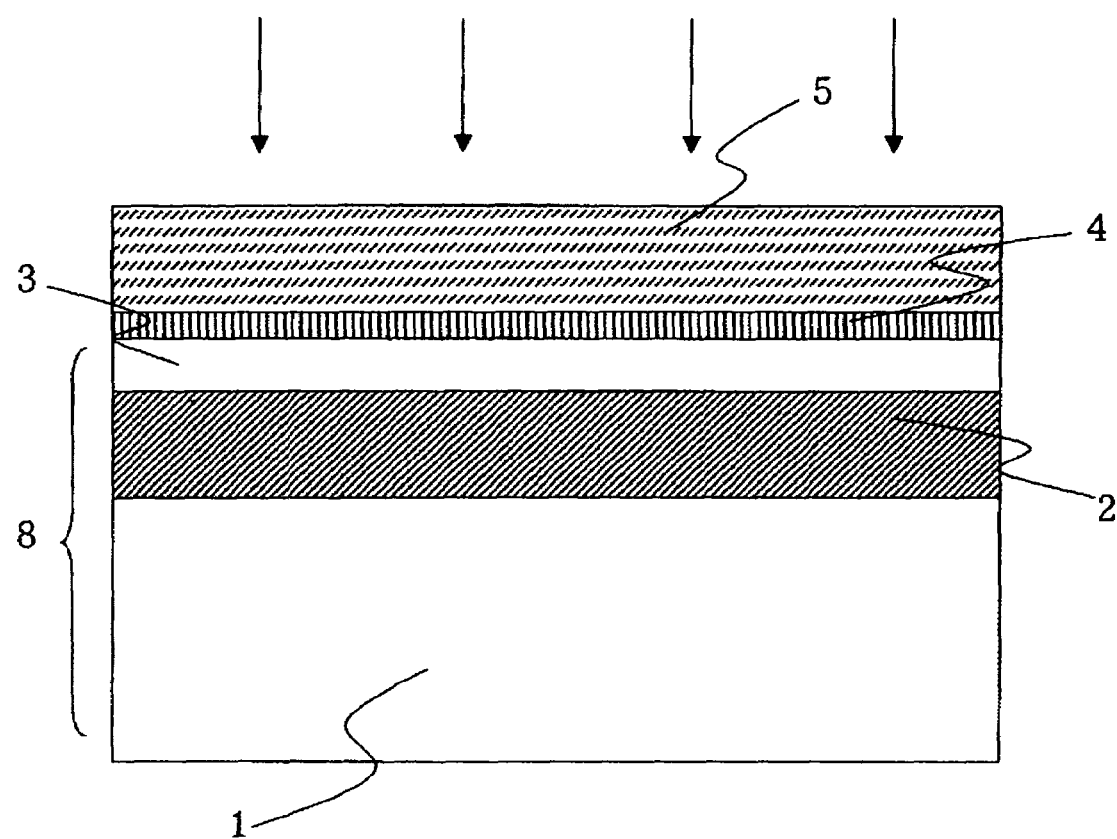
FIG. 1 is a conceptual view of the present invention.
Figure 3:
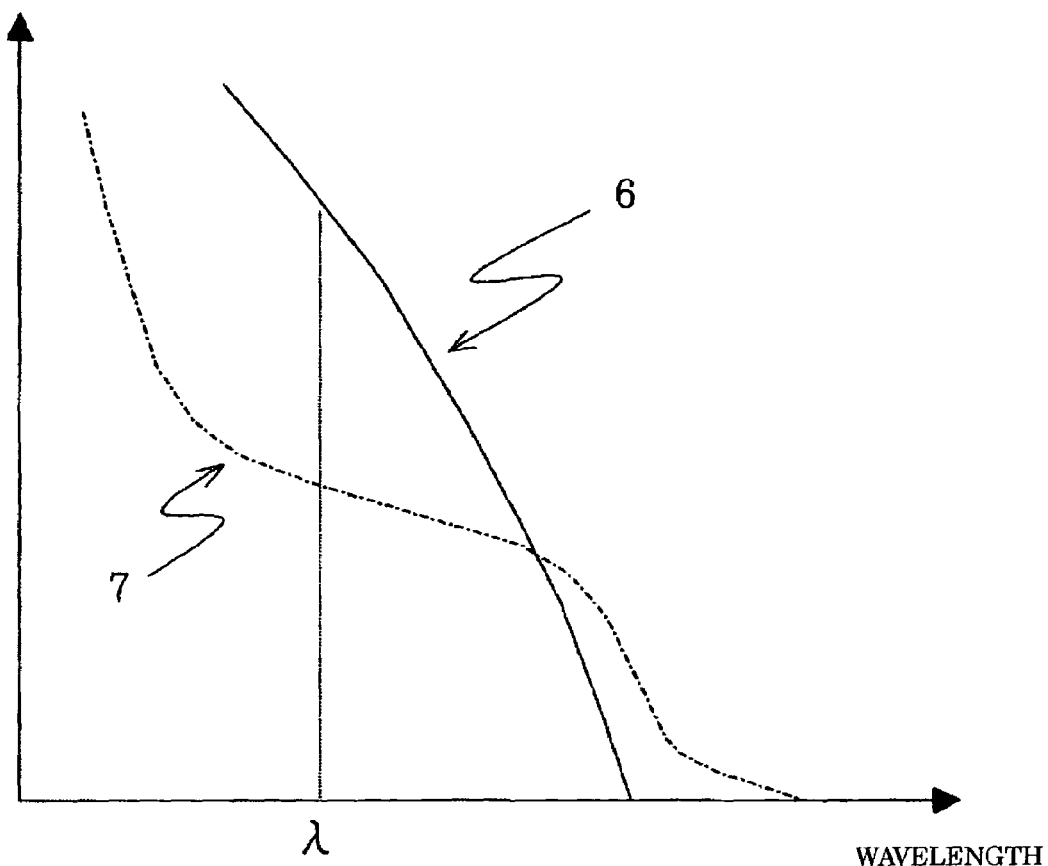
FIG. 3 is a schematic diagram indicating absorption coefficients of semiconductor nano-crystal.
Figure 4:
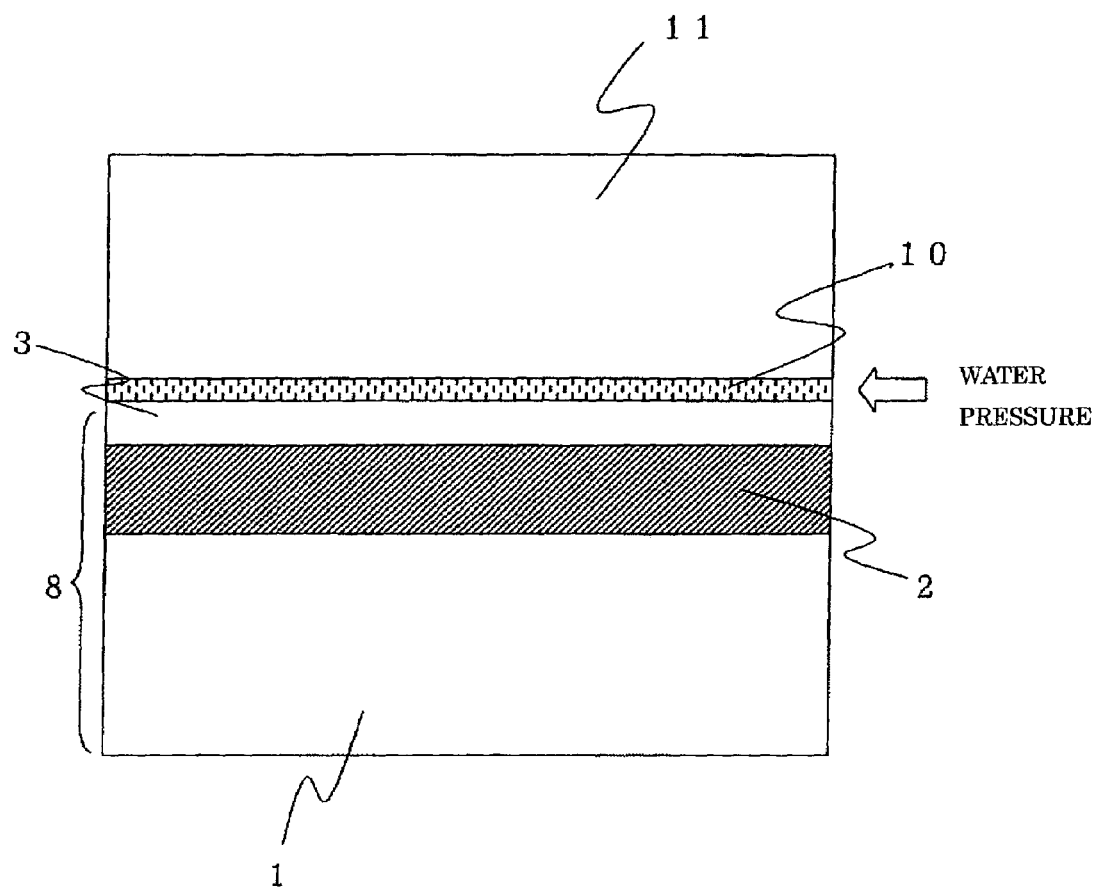
FIG. 4 is a conceptual view of conventional technology.

A general overview of the present invention is described with reference to FIG. 1. A silicon nano-crystal layer 4, a single crystal silicon layer 3 and a silicon oxide film (embedded dielectric film) 2 are provided on a sapphire substrate 5, which is laminated with a silicon substrate 1. As laser light in an ultraviolet region is irradiated from the side of the sapphire substrate 5, the laser light passes through the sapphire substrate and is absorbed by the silicon nano-crystal layer 4. Generally, silicon nano-crystal has a greater absorption coefficient in an ultraviolet region compared to silicon single crystal (FIG. 3), such that the laser light is absorbed by the silicon nano-crystal layer.4 before it reaches the single crystal silicon layer. For this reason, the silicon nano-crystal layer is instantly fused, thereby causing the sapphire substrate to separate. When the silicon nano-crystal layer has a film thickness that is at least twice as much as an inverse of its absorption coefficient or more, the single crystal silicon layer is not affected by the laser light. Accordingly, a high quality SOI wafer can be provided in a short time.

Figure 2A:
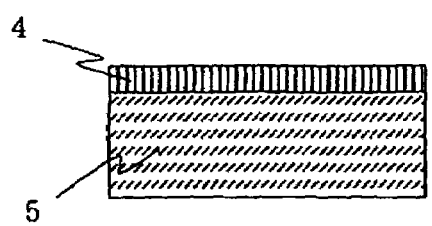
FIGS. 2A–2F show a manufacturing process of the present invention.
Figure 2B:
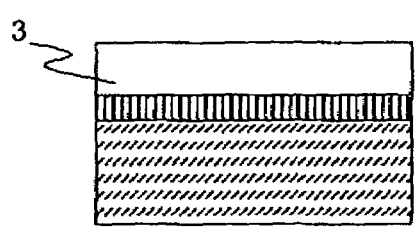

An embodiment example of the present invention is described with reference to the accompanying drawings. FIGS. 2A through 2F show a manufacturing process of the present invention. First, polysilicon or single crystal silicon is formed on a sapphire substrate 5, and it is changed to a silicon nano-crystal layer 4 by an anode formation method (FIG. 2A). Next, a surface of the silicon nano-crystal layer 4 is heat treated at about 1000° C. in a hydrogen atmosphere, to thereby single-crystallize the surface. By using the single crystal layer as a crystal seed, a single crystal silicon layer 3 is formed through an epitaxial growth by UHV-CVD method (FIG. 2B).

Figure 2C:
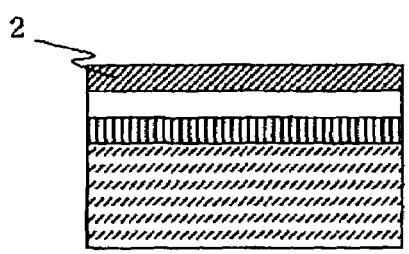
Figure 2D:
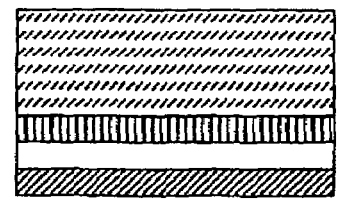
Figure 2D:
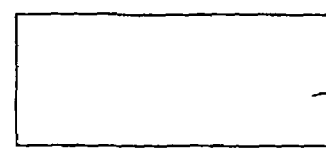

In the present embodiment example, the process is conducted, using disilane gas ($Si_2H_6$) (in a flow rate of 20–30 sccm) at 800° C. for 8–10 minutes to obtain a single crystal silicon layer 3 of about 2000 Angstrom in thickness. The epitaxial growth of silicon described above may be conducted by a MO-CVD method or a MBE method, instead of the UHV-CVD method. Then, a half of the single crystal silicon layer 3 obtained is changed to a silicon oxide film 2 by thermal oxidation at 1000° C. (FIG. 2C). Then, the silicon oxide film 2 side is attached to a silicon substrate 1 (FIG. 2D).

Figure 2E:
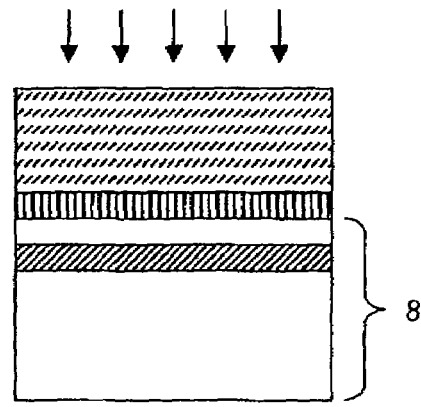
Figure 2F:
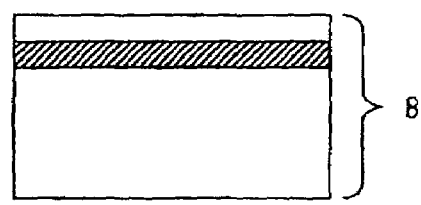

The silicon oxide film 2 and the surface of the silicon substrate 1 are bonded by intermolecular force, and a heat treatment is conducted at 1000° C. or higher in order to further strengthen the bonding. Laser light in an ultraviolet region is irradiated from the sapphire substrate side 5 on the wafer structure whose bonding is strengthened (FIG. 2E). In the present embodiment example, XeCl excimer laser with a wavelength of 308 nm is used. The laser irradiation in this instance is conducted five times consecutively with light having an intensity of 400–500 mJ over the entire surface of the wafer. The laser to be used may be any laser having other wavelength, such as, ArF, KrF or the like as long as the relation between the absorption coefficient of the silicon nano-crystal layer and its film thickness described above is satisfied. Through the steps described above, the sapphire substrate 5 is separated from the SOI wafer, and a high quality SOI wafer is obtained (FIG. 2F).

The use of the manufacturing method described above makes unnecessary the technique that forms a separation layer having a low mechanical strength or the high level control technique for converging water pressure at a separation layer having a low mechanical strength from the wafer side surface. Also, the means for separation is provided by laser beam, such that the wafer processing time is shortened. Accordingly, low cost SOI wafers can be provided.

By using the semiconductor manufacturing method according to the present invention, high quality SOI wafers that can be processed in a short time can be provided without requiring complex mechanical apparatuses of high controllability. Accordingly, low cost semiconductor devices using the SOI can be provided, and lower power consumption of portable information devices can be achieved.

What is claimed is:

1. A method for manufacturing a semiconductor device from a multiple layered wafer structure, wherein said multiple layered wafer structure includes, on a semiconductor substrate, a first dielectric layer, a single crystal semiconductor layer formed on the dielectric layer, a semiconductor nano-crystal layer formed on the single crystal semiconductor layer, and a second dielectric layer formed on the semiconductor nano-crystal layer, wherein laser irradiation is conducted from a side of the second dielectric layer, to thereby separate the second dielectric layer from other layers of the multiple layered wafer structure.

2. A semiconductor manufacturing method as in claim 1, wherein the multiple layered wafer structure is formed by: forming a single crystal or polycrystalline semiconductor layer on a second dielectric layer; changing the single crystal or polycrystalline semiconductor layer to a semiconductor nano-crystal layer by an anode formation method; heat treating a surface of the semiconductor nano-crystal layer in a hydrogen atmosphere; forming a semiconductor single crystal layer on the semiconductor nano-crystal layer; oxidizing a part of the surface of the semiconductor single crystal layer; laminating an oxide film on the surface of the single crystal semiconductor layer to another semiconductor substrate; and conducting a heat treatment after the step of laminating.

3. A semiconductor manufacturing method as in claim 1, wherein the multiple layered wafer structure separated is a silicon on insulator (SOI) structure.

4. A semiconductor manufacturing method as in claim 1, wherein the second dielectric layer is a sapphire, a quartz or another light-transmissive dielectric substrate.

5. A semiconductor manufacturing method as in claim 1, wherein the laser irradiation is conducted with excimer laser.

6. A semiconductor manufacturing method as in claim 2, wherein the step of forming the single crystal semiconductor layer on the semiconductor nano-crystal layer is conducted by one of a metal organic chemical vapor deposition method (MO-CVD method), a molecular beam epitaxial method (MBE method), and an ultra high vacuum chemical vapor deposition method (UHV-CVD method).

7. A semiconductor device that is manufactured by using the semiconductor manufacturing method recited in any one of claim 1 through claim 6.

8. A semiconductor manufacturing method as in claim 1, wherein said semiconductor nano-crystal layer has a greater absporption coefficient in an ultraviolet region than said single crystal semiconductor layer.

9. The semiconductor method of claim 5, wherein said excimer laser is an XeCl laser having a wavelength of approximately 308 nm.

10. The semiconductor method of claim 9, wherein the laser irradiation is conducted with light having an intensity of approximately 400–500 mJ over a surface of said wafer structure.

* * * * *